United States Patent
Fang et al.

(10) Patent No.: US 7,585,773 B2
(45) Date of Patent: Sep. 8, 2009

(54) NON-CONFORMAL STRESS LINER FOR ENHANCED MOSFET PERFORMANCE

(75) Inventors: Sunfei Fang, LaGrangeville, NY (US); Jun Jung Kim, Fishkill, NY (US); Thomas Dyer, Pleasant Valley, NY (US)

(73) Assignees: International Business Machines Corporation, Armonk, NY (US); Samsung Electronics Co., Ltd., Suwon-si, Gyeonggi-do (KR)

( * ) Notice: Subject to any disclaimer, the term of this patent is extended or adjusted under 35 U.S.C. 154(b) by 217 days.

(21) Appl. No.: 11/556,591

(22) Filed: Nov. 3, 2006

(65) Prior Publication Data

US 2008/0122003 A1      May 29, 2008

(51) Int. Cl.
*H01L 29/72* (2006.01)
(52) U.S. Cl. .................. 438/696; 438/142; 438/197; 438/595; 438/776
(58) Field of Classification Search .............. 438/142, 438/197, 595, 696, 776
See application file for complete search history.

(56) References Cited

U.S. PATENT DOCUMENTS 6,908,831 B2 *   6/2005   O'Riain et al. ............... 438/435
7,445,978 B2 *  11/2008   Teh et al. ..................... 438/199

OTHER PUBLICATIONS

Chen, et al., "Stress Proximity Technique for Performance Improvement with Dual Stress Liner at 45nm Technology and Beyond", 2006 Symposium on VLSI Technology Digest of Technical Papers, 2006 IEEE, 2 pages.
Fang, et al., "Process Induced Stress for CMOS Performance Improvement", IBM Semiconductor Research and Development Center (SRDC), Hopewell Junction, NY, Chartered Semiconductor Manufacturing, Infineon Technologies Ag, Samsung Electronics Co., 4 pages.

* cited by examiner

*Primary Examiner*—Edward Wojciechowicz
(74) *Attorney, Agent, or Firm*—Scully, Scott, Murphy & Presser, P.C.; Yuanmin Cai

(57) ABSTRACT

A semiconductor device is provided wherein at least one offset spacer is reduced and a non-conformal stress liner is thereafter deposited. By depositing the non-conformal stress liner in accordance with the present invention in close stress proximity to the FET, the carrier mobility and the performance of said device is significantly enhanced. The present invention is her directed to a method of fabricating said semiconductor device.

8 Claims, 2 Drawing Sheets

NON-CONFORMAL STRESS LINER FOR ENHANCED MOSFET PERFORMANCE

FIELD OF THE INVENTION

The present invention relates to high performance metal oxide semiconductor field effect transistors (MOSFETs). More particularly, the present invention is directed to a MOSFET structure comprising reduced or removed offset spacers and a non-conformal nitride stress liner. The enhanced performance of the MOSFET in accordance with the present invention is achieved through greater stress proximity of the stressed liner to the device channel leading to greater stress and ultimately enhanced carrier mobility. The present invention also relates to a method of fabricating said semiconductor device.

BACKGROUND OF THE INVENTION

For more than three decades, the continued miniaturization of MOSFETs has driven the worldwide semiconductor industry. Various showstoppers to continue scaling have been predicated for decades, but a history of innovation has sustained Moore's Law in spite of many challenges. However, there are growing signs today that metal oxide semiconductor transistors are beginning to reach their traditional scaling limits.

Since it has become increasingly difficult to improve MOSFETs and therefore CMOS performance through continued scaling, methods for improving performance without scaling have become critical. One approach for doing this is to increase carrier (electron and/or hole) mobilities. CMOS scaling has been mainly driven by stress induced carrier mobility enhancement since 90 nm technology node. Increased carrier mobility can be obtained, for example, by introducing the appropriate stress/strain into the semiconductor lattice.

The application of stress changes the lattice dimensions of the semiconductor substrate. By changing the lattice dimensions, the electronic band structure of the material is changed as well. The change may only be slight in intrinsic semiconductors resulting in only a small change in resistance, but when the semiconducting material is doped, i.e., n-type, and partially ionized, a very small change in the energy bands can cause a large percentage change in the energy difference between the impurity levels and the band edge. This results in changes in carrier transport properties, which can be dramatic in certain cases. The application of physical stress (tensile or compressive) can be farther used to enhance the performance of devices fabricated on the semiconductor substrates.

Compressive strain along the device channel increases drive current in p-type field effect transistors (pFETs) and decreases drive current in n-type field effect transistors (nFETs). Tensile strain along the device channel increases drive current in nFETs and decreases drive current in pFETs.

Stress can be introduced into a single crystal oriented substrate by several methods including, for example, forming a stress liner on top of the substrate and around the gate region. Depending on the conductivity type of the FET (i.e., p or n), the stress liner can be under tensile stress (preferred for nFETs) or compressive stress (preferred for pFETs).

In order to enhance MOSFET performance in the 65 nm technology node and below, stress liners are applied after salicide formation. The liner stress is transferred to the device channel thereby enhancing the carrier mobility. In MOSFETs, there is normally a nitride or oxide/nitride spacer(s) that is used to offset the source/drain dopant from channel, and to prevent silicide from shorting to gate and from punching through the shallow extension region. The stress transfer from liner to MOSFET channel is limited by the existence of the spacer due to proximity effects.

Accordingly, there are continuing efforts to enhance stress in semiconductor devices and thus achieve greater carrier mobility and ultimately greater device performance.

SUMMARY OF THE INVENTION

The present invention provides for the reduction or removal of the offset spacer(s) in a semiconductor device just prior to the deposition of a non-conformal stress liner. Said non-conformal stress liner replaces the conventional stress liners normally found in CMOS devices. With the reduction or removal of the offset spacer(s), the non-conformal stress liner can be deposited in close proximity to the device channel. The marked increase in stress proximity of the non-conformal stress liner to the device channel results in greatly improved performance as the strain transfer from the non-conformal stress liner to the channel is maximized. A compressive, non-conformal stress liner is provided which can improve the hole mobility in pFET devices. Similarly, a non-conformal tensile, stress liner is provided which can improve electron mobility in nFET devices.

In general terms, the present invention provides a semiconductor structure including a non-conformal stress liner that comprises:

a semiconductor substrate having at least one field effect transistor (FET) located thereon;

at least one reduced offset spacer; and a non-conformal stress liner located on a portion of said semiconductor substrate and surrounding said at least one FET.

In one embodiment of the present invention, the at least one FET is a pFET, and said non-conformal stress liner is a compressive stress liner deposited in close proximity to the device channel. In another embodiment of the present invention, the at least one FET is an nFET, and said non-conformal stress liner is a tensile stress liner deposited in close proximity to the device channel.

In accordance with the present invention, the offset spacer(s) are reduced just prior to the deposition of the non-conformal stress liner. The reduction of the offset spacer(s) is performed by methods well known in the art, such as by selectively etching the spacer(s) or wet etch like hot phosphorous acid. Said method preferably removes the offset spacer(s) entirely to allow for the greatest enhanced stress proximity.

In addition to the above, the present invention also relates to a method of fabricating such a semiconductor structure. In general terms, the method of the present invention comprises:

providing at least one field effect transistor (FET) on a surface of a semiconductor substrate and having at least one offset spacer;

reducing said offset spacer; and forming a non-conformal stress liner on a portion of said semiconductor substrate and surrounding said at least one FET.

DETAILED DESCRIPTION OF THE INVENTION

The present invention, which provides a semiconductor structure including a non-conformal stress liner that is employed together with offset spacer reduction or removal (SPR) in order to increase the mechanical stress into the device channel, will now be described in greater detail by referring to the following discussion and drawings that accompany the present application. It is noted that the drawings of the present application are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

As stated above, the present invention provides a non-conformal stress liner which replaces conventional stress liners in CMOS devices. A compressive, non-conformal stress liner is provided which can improve the hole mobility in pFET devices. A tensile, non-conformal stress liner is also provided which improves electron mobility in nFET devices. Both improvements are also due to the reduction or removal of the offset spacer(s) in the semiconductor device.

Figure 1:
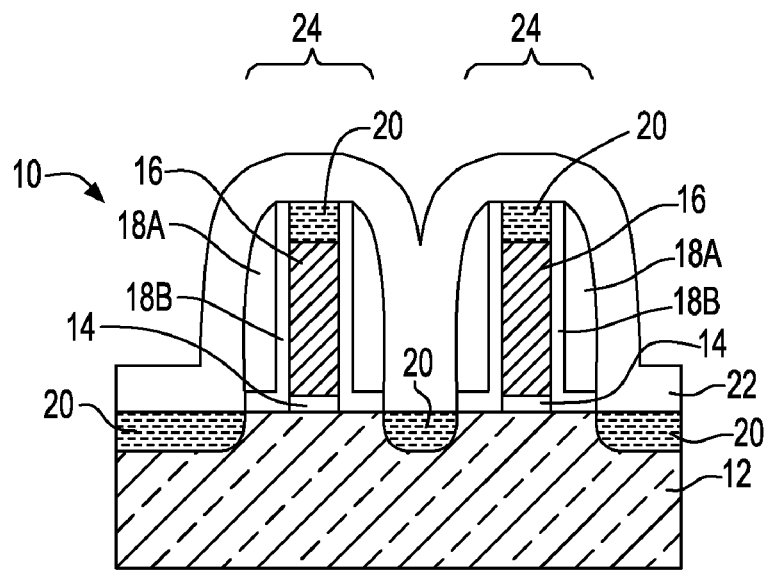
FIG. 1 is a schematic (through a cross sectional view) illustrating a semiconductor device having a conventional stress liner in its structure.

Reference is now made to FIG. 1, a cross sectional view illustrating a conventional semiconductor device having offset spacers and a conformal stress liner. Said offset spacers, although providing some important functions, limits the stress transfer that can occur from liner to MOSFET channel due to proximity effects. Specifically, the conventional semiconductor structure 10 comprises a semiconductor substrate 12 that includes at least one field effect transistor (FET) 24 located on the surface of the semiconductor substrate 12. A typical FET includes at least a gate dielectric 14, a gate electrode 16 and at least one offset spacer 18. In FIG. 1, a pair of offset spacers 18A and 18B are shown by way of example. Said semiconductor structure 10 also comprises silicide regions 20 and a conformal stress liner 22.

Figure 2:
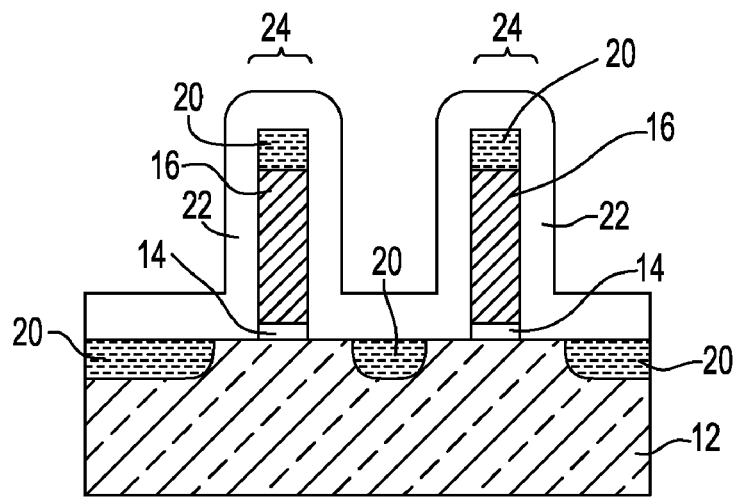
FIG. 2 is a schematic (through a cross sectional view) illustrating a semiconductor structure comprising a conformal stress liner with offset spacer removed.

FIG. 2 illustrates the first step in the transformation of the conventional semiconductor structure shown in FIG. 1 into the device structure in accordance with the present invention. Specifically, FIG. 2 illustrates the semiconductor device as shown in FIG. 1 having had the offset spacers 18A and 18B removed. As depicted in FIG. 2, the structure is still includes a conformal stress liner 22.

Figure 3:
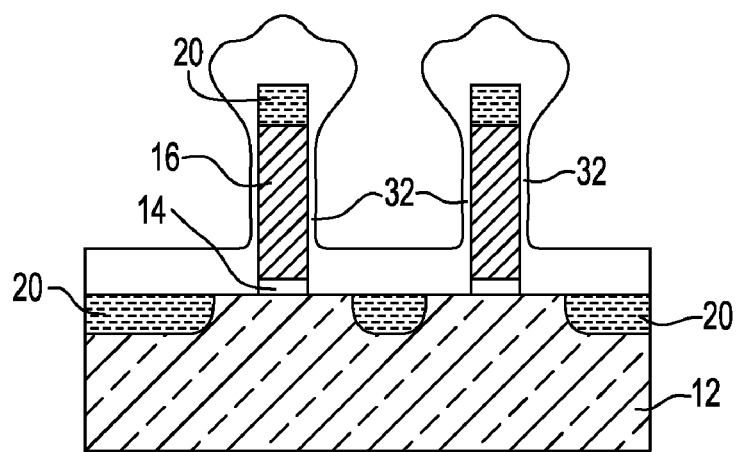
FIG. 3 is a schematic (through a cross sectional view) illustrating the semiconductor structure in accordance with the present invention and comprising a non-conformal stress liner with offset spacer removed.

FIG. 3 illustrates the semiconductor structure in accordance with the present invention. As shown in FIG. 2, the offset spacers 18A and 18B have been removed and the conventional conformal stress liner 22 has been replaced with a highly non-conformal stress liner 30.

In accordance with the present invention, the at least one FET 24 can be an nFET or a pFET.

The semiconductor structures 10 shown in FIGS. 1-3 are fabricated on 65 nm and 45 nm bulk technology using conventional complementary metal oxide semiconductor processing techniques well known to those skilled in the art. For example, deposition of various material layers, lithography, etching, ion implantation and annealing can be used in forming the FETs. A conventional self-aligned silicidation process can be used in forming the silicided regions shown in the figures.

The semiconductor substrate 12 includes any semiconductor material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) are also contemplated herein. Typically, the semiconductor substrate 12 is a Si-containing semiconductor such as, for example, Si, SiC, SiGe, SiGeC, or a silicon-on-insulator or any of the above-mentioned substrate material or combination thereof on insulator. The substrate 12 may be unstrained, strained or include regions of strain and unstrain therein. The substrate 12 may be intrinsic or it may be doped with, for example, but not limited to: B, As or P.

The at least one offset spacer 18 is typically comprised of an oxide, nitride or oxynitride including combinations and multilayers thereof. For example, in a structure having a pair of spacers 18A and 18B, the inner spacer is typically comprised of an oxide, while the outer spacer is typically comprised of a nitride.

Prior to the deposition of the conformal stress liner 22 to the conventional semiconductor structure 10 shown in FIG. 1, the method in accordance with the present invention comprises reducing or removing the offset spacer 18. The reduction or removal of the offset spacer(s) is performed by methods well known in the art, such as by selectively etching the spacer(s) or wet etching with hot phosphorous acid. The goal is to remove, or reduce, the offset spacer by an amount of about 50% or greater. Said method preferably removes greater than 90% of the offset spacer(s), more preferably greater than 95% of the offset spacer(s) and most preferably greater than 99% of the offset spacer(s) to allow for the greatest enhanced stress proximity.

In accordance with the method of the present invention, following the reducing or removal of the offset spacer 18, and instead of depositing the conventional stress liner 22, a highly non-conformal stress liner 30 is formed on a portion of the semiconductor substrate 12 and surrounding said at least one FET 24. The non-conformal stress liner 30 may comprise any stress inducing material known in the art. The preferred material of the non-conformal stress liner is a nitride film. Although any process capable of depositing a non-conformal nitride film may be used in accordance with the present invention, a preferred deposition process is a HDP (high density plasma) process. Other processes include a PECVD (plasma enhanced chemical vapor deposition) method. As shown in FIG. 3, the nitride non-conformal stress liner 30 is deposited so that there is less nitride 32 on the gate sidewalls of the FET leading to enhanced stress in the device channel of the structure. More specifically, the non-conformal stress liner 30 in accordance with the present invention comprises a liner thickness ratio of sidewall to flat surface of less than about 50%.

Figure 4:
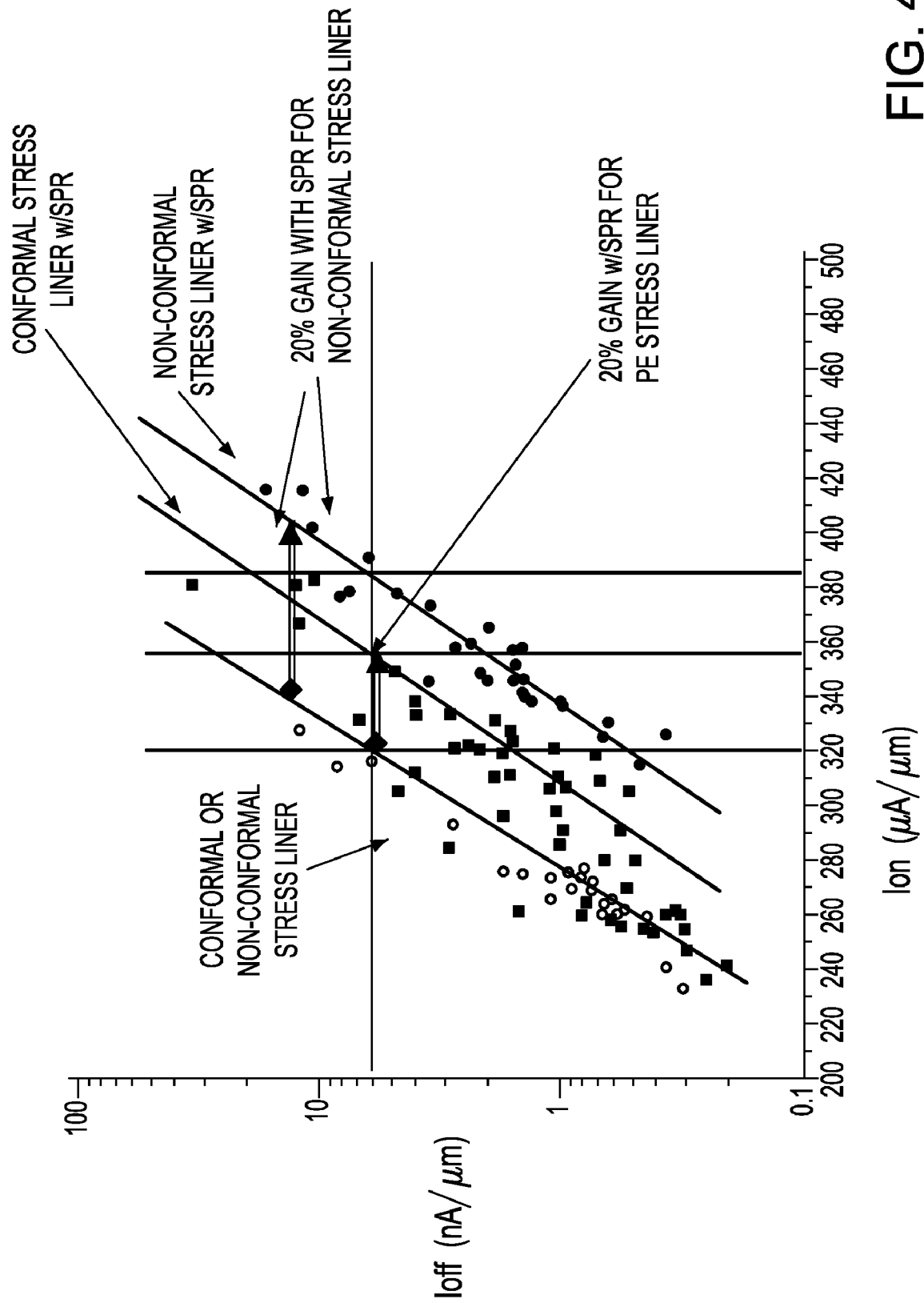
FIG. 4 is a graph depicting the significant enhancement in performance of a pFET device obtained by the semiconductor device in accordance with the present invention as opposed to the performance of a semiconductor device comprising conformal and/or non-conformal stress liners without spacer removal, as well as a semiconductor device comprising a conformal stress liner with spacer removal.

The non-conformal stress liner 30 that is formed at this point of the present application is typically a stress liner that is capable of generating a compressive stress in the device channel of the FETs that results in an increase in pFET performance of about 20% greater than the conventional conformal and non-conformal stress liner structures having had no offset spacer removal. The performance of a structure having had offset spacer removal and comprising a conformal PE nitride stress liner was also compared with the structure of the present invention. The present invention showed a 10% gain in performance over said structure. The results are all shown in FIG. 4. Comparative results would equally apply to NFET performance.

The above processing technique can also be used in fabricating a structure including at least one nFET and at least one pFET including the appropriate stress liners surrounding each of the FETs.

Wile the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing at least one field effect transistor (FET) on a surface of a semiconductor substrate and having at least one offset spacer abutting a sidewall of a gate structure;
   removing greater than about 50% of said offset spacer; and
   forming a non-conformal stress liner on a portion of said semiconductor substrate and surrounding said at least one FET, wherein a portion of the non-conformal stress liner that is present on an upper surface of the gate structure has a width greater than the gate structure and extends beyond an outer surface of the non-conformal stress liner that is present on the sidewall of the gate structure.

2. The method of claim 1 wherein said reducing said at least one offset spacer comprises selectively etching said at least one offset spacer.

3. The method of claim 1 further comprising removing at least 90% of said offset spacer.

4. The method of claim 1 further comprising removing at least 99% of said offset spacer.

5. The method of claim 1 wherein said forming said non-conformal stress liner comprises a HDP process.

6. The method of claim 1 wherein said non-conformal stress liner is a nitride liner.

7. The method of claim 1 wherein said at least one FET is a pFET and said non-conformal stress liner is a compressed stress liner.

8. The method of claim 1 wherein said at least one FET is an nFET and said non-conformal stress liner is a tensile stress liner.

* * * * *